(12) United States Patent
Bang (10) Patent No.: US 8,912,652 B2
(45) Date of Patent: Dec. 16, 2014

(54) SEMICONDUCTOR DEVICE AND METHOD FOR MANUFACTURING THE SAME

(71) Applicant: Dongbu HiTek Co., Ltd., Gyeonggi-do (KR)

(72) Inventor: Ki Wan Bang, Gyeonggi-do (KR)

(73) Assignee: Dongbu HiTek Co., Ltd., Bucheon-si (KR)

( * ) Notice: Subject to any disclaimer, the term of this patent is extended or adjusted under 35 U.S.C. 154(b) by 0 days.

(21) Appl. No.: 13/906,441

(22) Filed: May 31, 2013

(65) Prior Publication Data

US 2014/0175645 A1    Jun. 26, 2014

(30) Foreign Application Priority Data

Dec. 24, 2012  (KR) .................. 10-2012-0151757

(51) Int. Cl.
*H01L 23/00* (2006.01)
*G01B 11/14* (2006.01)
*H01H 35/14* (2006.01)
*H01H 35/02* (2006.01)
*H01H 1/16* (2006.01)

(52) U.S. Cl.
CPC ............... *H01L 24/11* (2013.01); *H01L 24/13* (2013.01); *G01B 11/14* (2013.01); *H01H 35/142* (2013.01); *H01H 35/02* (2013.01); *H01H 1/16* (2013.01)
USPC .... 257/738; 257/737; 257/780; 257/E29.324; 257/E23.021; 200/61.45 R; 200/61.48; 200/61.51; 200/61.52; 200/61.53; 200/277; 73/514.01; 340/689

(58) Field of Classification Search
CPC ..... G01B 11/14; H01H 35/142; H01H 35/02; H01H 1/16

USPC .......... 257/737, 738, 780, E29.324, E23.021; 200/61.45 R, 61.48, 61.51, 61.52, 200/61.53, 277; 73/514.01; 340/689
See application file for complete search history.

(56) References Cited

U.S. PATENT DOCUMENTS

| | | | |
|---|---|---|---|
| 7,381,916 B2 | 6/2008 | Wong | |
| 2010/0059345 A1* | 3/2010 | Blank | ............. 200/61.45 R |
| 2011/0088478 A1* | 4/2011 | Shimase | ................ 73/649 |

FOREIGN PATENT DOCUMENTS

| | | |
|---|---|---|
| JP | 10-048250 | 2/1998 |
| JP | 2009-238715 | 10/2009 |
| KR | 10-2009-0094072 | 9/2009 |

OTHER PUBLICATIONS

Apr. 10, 2014 Notice of Allowance for related Korean application.

*Primary Examiner* — Peniel M Gumedzoe
(74) *Attorney, Agent, or Firm* — Andrew D. Fortney; Central California IP Group, P.C.

(57) ABSTRACT

Embodiments relate to a method for manufacturing a semiconductor device including at least one of: (1) Forming a lower electrode pattern on a substrate. (2) Forming an etch stop film on/over the lower electrode pattern. (3) Forming a first interlayer insulating layer on/over the etch stop film. (4) Forming an upper electrode pattern on/over the first interlayer insulating layer. (5) Forming a second interlayer insulating layer on/over the upper electrode pattern. (6) Forming an etch blocking layer positioned between the lower electrode pattern and the upper electrode pattern which passes through the second interlayer insulating layer and the first interlayer insulating layer. (7) Forming a cavity which exposes a side of the etch blocking layer by etching the second interlayer insulating layer and the first interlayer insulating layer. (8) Forming a contact ball in the cavity.

20 Claims, 11 Drawing Sheets

SEMICONDUCTOR DEVICE AND METHOD FOR MANUFACTURING THE SAME

This application claims the benefit of the Patent Korean Application No. 10-2012-0151757, filed on Dec. 24, 2012, which is hereby incorporated by reference in its entirety.

BACKGROUND

Embodiments relate to semiconductor devices and/or methods for manufacturing semiconductor devices. Embodiments relate to Micro Metal Sphere switches and/or methods for manufacturing Micro Metal Sphere switches.

MEMs (Micro Metal Sphere system) devices may have micro-scale size and/or may perform electro-mechanical operations, in accordance with embodiments. Aspects of MEMs device production may include specialized semiconductor manufacturing processes, in accordance with embodiments. Low priced batch manufacturing may be one desirable aspect of semiconductor processing.

MEMs devices have applications as sensor, switches, micro-resonators, variable capacitors, variable inductors and/or other similar devices/applications, in accordance with embodiments. In embodiments, examples of sensors are pressure sensors, inertia sensors, position sensors (e.g. used in GPS systems, game consoles, and/or similar), image sensors (e.g. used in digital cameras, camcorders, and similar devices), and other types of devices. In embodiments, an example of switches includes RF switches. In embodiments, MEMs device included in a switching device may be desirable to assure reliability of the switching device and/or to assure a desirable manufacturing yield.

SUMMARY

Embodiments relate to semiconductor devices and/or method of manufacturing semiconductor devices. Embodiments may relate to semiconductor device with desirables degrees of freedom in an upper electrode pattern, which may assure reasonable levels of reliability in switching devices. Embodiments may maintain a desirable manufacturing yields through reductions in dropping.

Embodiments relate to a method of manufacturing a semiconductor device including at least one of the following steps: (1) forming a lower electrode pattern on/over a substrate, (2) forming an etch stop film on/over the lower electrode pattern, (3) forming a first interlayer insulating layer on/over the etch stop film, (4) forming an upper electrode pattern on/over the first interlayer insulating layer, (5) forming a second interlayer insulating layer on/over the upper electrode pattern, (6) forming an etch blocking layer positioned between the lower electrode pattern and the upper electrode pattern passing through the second interlayer insulating layer and/or the first interlayer insulating layer, (7) forming a cavity which exposes a side of the etch blocking layer by etching the second interlayer insulating layer and/or the first interlayer insulating layer, and/or (8) forming a contact ball in the cavity.

In embodiments, the etch blocking layer may be formed to overlap a region of the etch stop film positioned (e.g. in a vertical direction) between the lower electrode pattern and the upper electrode pattern. In embodiments, the etch blocking layer may be formed to be in contact with a region of the etch stop film positioned between the lower electrode pattern and the upper electrode pattern. In embodiments, the etch blocking layer may be formed to be in contact with a side of the upper electrode pattern. In embodiments, the etch blocking layer may be formed to be spaced from the upper electrode pattern.

Embodiments relate to a method which may include at least one of the following steps: (1) forming a contact in the second interlayer insulating layer, and/or (2) forming a connection line on the second interlayer insulating layer to connect the contact to the etch blocking layer. In embodiments, the contact may be connected to the upper electrode pattern passing through the second interlayer insulating layer In embodiments, a semiconductor device may include at least one of: (1) a lower electrode pattern formed on/over a substrate, (2) an etch stop film formed on/over the lower electrode pattern and the substrate, (3) a first interlayer insulating layer formed on/over the etch stop film, (4) an upper electrode pattern formed on/over the first interlayer insulating layer, (5) a second interlayer insulating layer formed on/over the upper electrode pattern, (6) an etch blocking layer formed between the lower electrode pattern and the upper electrode pattern passing through the second interlayer insulating layer and the first interlayer insulating layer, (7) a cavity formed in the second interlayer insulating layer and the first interlayer insulating layer to expose a side of the etch blocking layer, and/or (8) a contact ball formed in the cavity. In embodiments, the etch blocking layer may overlap with a region of the etch stop film positioned (e.g. in a vertical direction) between the lower electrode pattern and the upper electrode pattern. In embodiments, the etch blocking layer may be in contact with a region of the etch stop film positioned between the lower electrode pattern and the upper electrode pattern. In embodiments, the etch blocking layer may be in contact with a side of the upper electrode pattern. In embodiments, the etch blocking layer may be spaced from the upper electrode pattern. In embodiments, a portion of the second interlayer insulating layer may be between the etch blocking layer and the upper electrode pattern. Embodiments may include a contact connected to the upper electrode pattern which passes through the second interlayer insulating layer. Embodiments may include a connection line formed on/over the second interlayer insulating layer to connect the contact to the etch blocking layer.

DRAWINGS

Example

Example

Example

Example

Example

DESCRIPTION

Example FIGS. 2A to 2E illustrate sections showing a method for manufacturing a semiconductor device, in accordance with embodiments. For example, in embodiments, a method may relate to manufacturing an MEM (Micro Metal Sphere) switch.

Figure 2A:
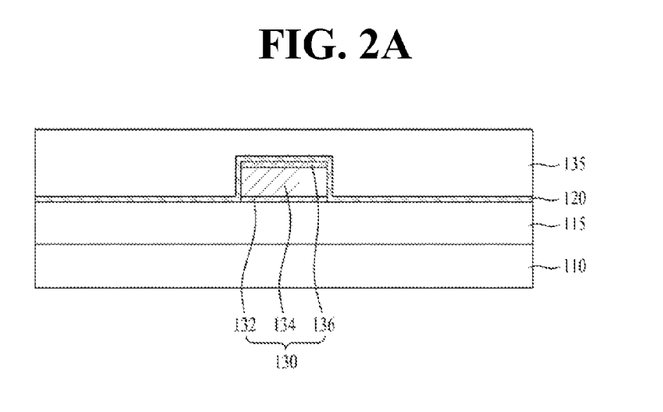
FIGS. 2A to 2E illustrate sections illustrating a method for manufacturing a semiconductor device, in accordance with embodiments.

FIG. 2A illustrates an insulating layer 115 formed on/over a substrate 110, in accordance with embodiments. The substrate 110 may be a mono-crystalline silicon substrate, a poly-crystalline silicon substrate, a semiconductor substrate, and/or a similar type of substrate. The substrate 110 may have a device isolation film formed thereon dividing an active region and a device isolation region, in accordance with embodiments. The substrate 110 may have p type impurities or n type impurities doped therein.

The insulating layer 115 may include at least one of oxide and nitride, in accordance with embodiments. The insulating layer 115 may be single or multi-layered. For example, the insulating layer 115 may be deposited on the substrate by CVD (Chemical Vapor Deposition), and may include at least one of $SiO_2$, $Si_xN_y$ (Where, x, and y are real numbers), FSG (Fluoro Silicate glass), USG (Undoped Silicate Glass), BPSG (Boron Phospho Silicate Glass), and TEOS (TetraEthOxySilane), and/or other similar materials.

A lower electrode pattern 130 may be formed on/over the insulating layer 115. The lower electrode pattern 130 may have a stack structure including a first barrier layer 132, a first main electrode layer 134, and/or a second barrier layer 136. The first barrier layer 132 and/or the second barrier layer 136 may prevent metal ions of the first main electrode layer 134 from diffusing into other layer (e.g. the insulating layer 115).

The first and the second barrier layers 132 and 136 may be formed of a material which blocks diffusion of the metal ions (e.g. TiN, Ti, a TiN/Ti alloy, and/or similar materials). The first main electrode layer 134 may be formed of a material having relatively good conductivity (e.g. Al, Au, Cu, an alloy including at least one of Al, Au, and Cu, an Al—Cu alloy, and/or similar material).

The lower electrode pattern 130 may include a plurality of lower electrodes spaced apart from one another and/or electrically isolated from each another. Although FIG. 2A illustrates only one lower electrode 130, any practical number of the lower electrodes are within the scope of embodiments (e.g. two or more).

For example, in embodiments, by depositing the first barrier layer 132, the first main electrode layer 134, and/or the second barrier layer 136 on/over the insulating layer 115 in succession by CVD (Chemical Vapor Deposition) and by patterning the layers 132, 134, and 136 by photolithography and/or etching, the lower electrode pattern 130 may be formed. An etch stop film 120 may be formed on/over the insulating layer 115 to cover the lower electrode pattern 130. For example, the etch stop film 120 may be formed at sides of the first and second barrier layers 132 and 136, on/over an upper side of the barrier layer 136, and/or on/over a surface of the insulating layer 115.

Figure 2B:
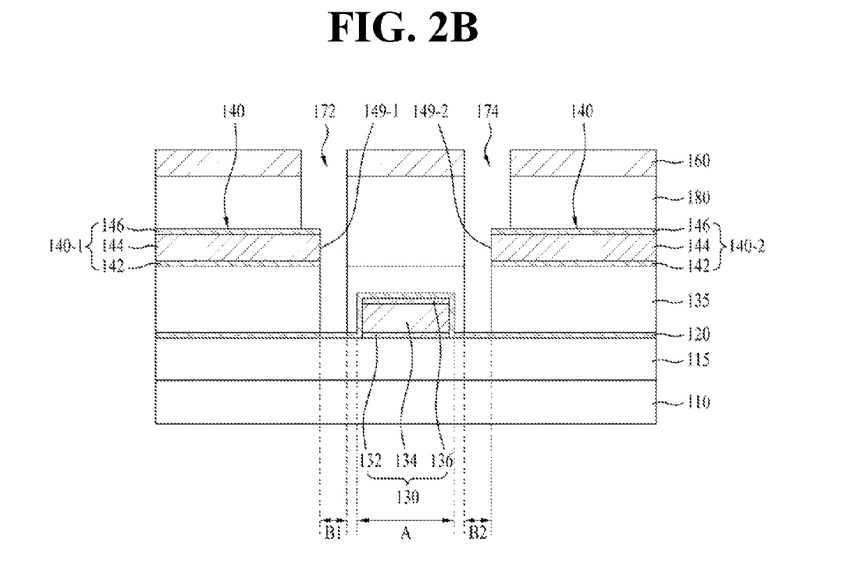
Figure 2C:
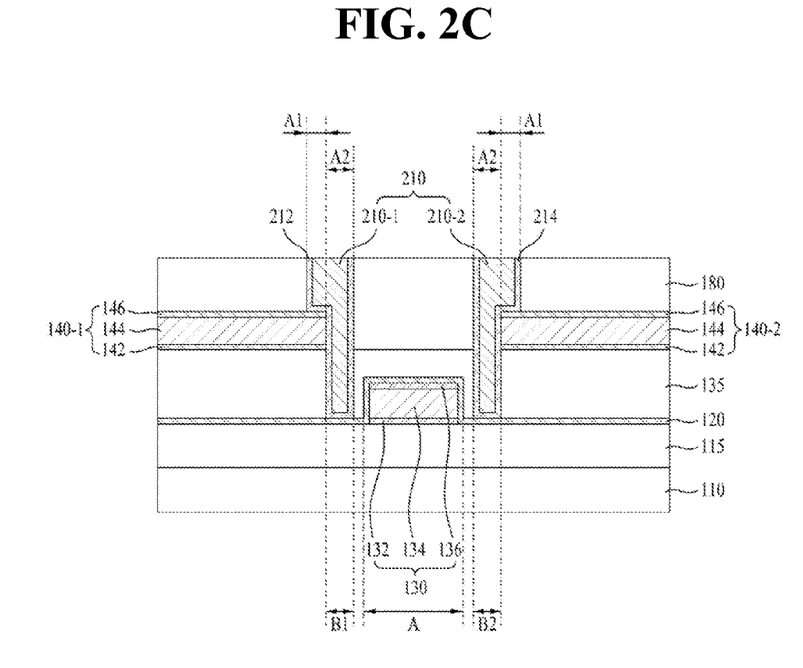
Figure 2D:
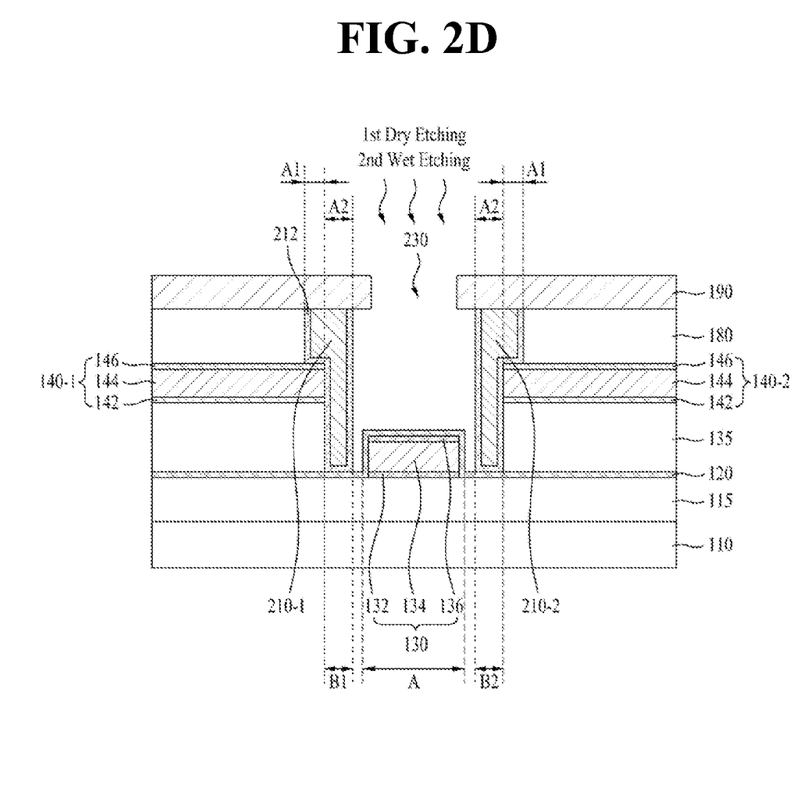

In embodiments, the etch stop film 120 may stop etching during etching by providing a space 230 shown in FIG. 2D to position a contact ball therein. The etch stop film 120 may be formed of a material having etch selectivity higher than interlayer insulating layers 135 and 180 (e.g. silicon nitride SiN). The first interlayer insulating layer 135 may be formed on/over the etch stop film 120. For example, the first interlayer insulating layer 135 may be formed on/over the etch stop film 120 by CVD (Chemical Vapor Deposition). In embodiments, the first interlayer insulating layer 135 may include at least one of oxide, nitride, $SiO_2$, $Si_xN_y$ (Where, x, and y are real numbers), FSG (Fluoro Silicate glass), USG (Undoped Silicate Glass), BPSG (Boron Phospho Silicate Glass), TEOS (TetraEthOxySilane), and/or similar materials.

A contact may be formed in contact with the lower electrode pattern 130 which passes through the first interlayer insulating layer 135 and/or the etch stop film 120, in accordance with embodiments. For example, a contact may be formed having one end in contact with an upper side of the lower electrode pattern 130 which passes through a region of each of the first interlayer insulating layer 135 and the etch stop film 120, with the other end of the contact exposed from the first interlayer insulating layer 135.

Referring to FIG. 2B, an upper electrode pattern 140 may be formed on/over the first interlayer insulating layer 135, in accordance with embodiments. The upper electrode pattern 140 may have a stack structure including a third barrier layer 142, a second main electrode layer 144, a fourth barrier layer 146, and/or similar layer. The third barrier layer 142 and the fourth barrier layer 146 may serve to prevent metal ions of the second main electrode layer 144 from diffusing into other layers (e.g. the first and second interlayer insulating layers 135 and 180).

In embodiments, the third and fourth barrier layers 142 and 146 may be formed of a barrier metal material (e.g. TiN, Ti, a TiN/Ti alloy, and/or similar material). In embodiments, the second main electrode layer 144 may be formed of a material having relatively good conductivity (e.g. Al, Cu, Au, an Al—Cu alloy, an alloy including at least one of Al, Cu, and Au, and/or similar material).

The upper electrode pattern 140 may include a plurality of upper electrodes (e.g. 140-1 and 140-2) spaced from one another to be electrically isolated from one another. For example, the upper electrode pattern 140 may include the first upper electrode 140-1 and the second upper electrode 140-2. For example, the third barrier layer 142, the second main electrode layer 144, and/or the fourth barrier layer 146 may be deposited on/over the first interlayer insulating layer 135 (e.g. by Chemical Vapor Deposition) in succession. Layers 142, 144, and 146 may be patterned by photolithography and/or etching to form a plurality of the upper electrodes (e.g. 140-1 and 140-2) which may be formed spaced apart from one another. In embodiments, at least one of the upper electrodes (e.g. 140-1 and 140-2) may be in contact with the other end of an exposed contact.

The photolithography patterning and etching may expose a side of each of the plurality of the upper electrodes (e.g. 140-1, and 140-2). For example, a side 149-1 or 149-2 of the second main electrode layer 144 in each of the plurality of the upper electrodes (e.g. 140-1 and 140-2) may be exposed or opened from the third and/or fourth barrier layers 142 and 146. The patterning by photolithography and etching may expose or open a portion of the first interlayer insulating layer 135 (e.g. a portion of an upper side of the first interlayer insulating layer 135).

In embodiments, a second interlayer insulating layer 180 is formed on/over the first interlayer insulating layer 135 to cover the upper electrode pattern 140. The second interlayer insulating layer 180 may be formed similarly or substantially the same as with the first interlayer insulating layer 135, in accordance with embodiments.

In embodiments, a plurality of trenches (e.g. 172 and 174) may be formed to expose the side (e.g. 149-1 and/or 149-2) of each of the plurality of the upper electrodes (e.g. 140-1 and/or 140-2). In embodiments, the trench may expose a portion of an upper side of the upper electrode (e.g. 140-1 and/or 140-2) adjacent to the exposed side (e.g. 149-1 and/or 149-2) of the upper electrode (e.g. 140-1 and/or 140-2).

In embodiments, the first trench 172 may expose a side of the second main electrode layer 144 of the first upper electrode 140-1 and the second trench 174 may expose a side of the second main electrode layer 144 of the second upper electrode 140-2. In embodiments, the first trench 172 may expose a portion of an upper side of the fourth barrier layer 146 of the first upper electrode 140-1 adjacent to the exposed side of the second main electrode layer 144 of the first upper electrode 140-1. The second trench 174 may expose a portion of an upper side of the fourth barrier layer 146 of the second upper electrode 140-2 adjacent to the exposed side of the second main electrode layer 144 of the second upper electrode 140-2.

The first trench 172 (which may expose the side 149-1 of the first upper electrode 140-1) and the second trench 174 (which may expose the side 149-2 of the second upper electrode 140-2) may be formed in the second interlayer insulating layer 180 and the first interlayer insulating layer 135, in accordance with embodiments. A number of the trenches 201 and 202 may be formed. In embodiments trenches may be the same or different in size, shape, and quantity as trenches 201 and 202.

For example, a photoresist pattern 160 may be formed on/over the second interlayer insulating layer 180 and the first interlayer insulating layer 135 by photolithography to form the trenches 172 and 174. In a "a trench forming etching step", the second interlayer insulating layer 180 and the first interlayer insulating layer 135 may be etched by using the photoresist pattern 160 as an etch mask to form the first trench 201 (which may expose the side 149-1 of the first upper electrode 140-1) and the second trench 174 (which may expose the side 149-2 of the second upper electrode 140-2), in accordance with embodiments. For example, in embodiments, the exposed side 149-1 of the first upper electrode 140-1 and the exposed side 149-2 of the second upper electrode 140-2 may face each other.

The trenches 172 and 174 may expose the etch stop film 120. The trench forming etching step may be stopped after the etch stop film 120 is exposed. In embodiments, the etch stop film 120 may serve as an etch stop film of the trench forming etching step.

The trenches 172, and 174 may be formed spaced apart from a first region A of the etch stop film 120 positioned on the lower electrode pattern 130. The trenches 172 and 174 positioned adjacent to the first region A may expose regions (e.g. B1 and B2) spaced from the first region A, in accordance with embodiments.

In embodiments, the first trench 172 may expose a second region B1 of the etch stop film 120 positioned on one side of the first region A of the etch stop film 120 positioned on/over the lower electrode pattern 130. The second trench 174 may expose a third region B2 of the etch stop film 120 positioned on the other side of the first region A. The second region B1 and the third region B2 may be regions of the etch stop film 120 positioned between the lower electrode pattern 130 and the upper electrode pattern 140, in accordance with embodiments.

The trenches 172 and 174 may not align and/or overlap with the lower electrode pattern in a vertical direction. In embodiments, the vertical direction may be a direction facing from the first interlayer insulating layer 135 to the second interlayer insulating layer 180. In embodiments, a portion of each of the fourth barrier layer 146 and the main electrode layer 144 of the first upper electrode 140-1 and the second upper electrode 140-2 exposed in the trench may be etched and removed.

Referring to FIG. 2C, by removing remained photoresist pattern 160 and filling a conductive material in the trenches 172 and 174, an etch blocking layer 210 may be formed, in accordance with embodiments. In embodiments, the photoresist pattern 160 may be removed by ashing and/or stripping. The etch blocking layer 210 may be formed in each of the plurality of trenches (e.g. 172 and 174), in accordance with embodiments. The etch blocking layer 210 may be positioned on a side 149-1 or 149-2 of each of the plurality of upper electrodes (e.g. 140-1 and 140-2) and may be in contact with the side 149-1 or 149-2.

The etch blocking layer 210 may be positioned on a portion of an upper side of the upper electrodes 140-1 and 140-2 adjacent to the side 149-1 and 149-2, in accordance with embodiments. In embodiments, the etch blocking layer 210 may cover the side 149-1 and 149-2 and the portion of the upper side of the upper electrodes 140-1 and 140-2 adjacent to the side 149-1 and/or 149-2.

The etch blocking layers (e.g. 210-1 and 210-2) positioned on the sides 149-1 and 149-2 of the plurality of upper electrodes (e.g. 140-1 and 140-2) may be spaced apart from one another, in accordance with embodiments. However, embodiments are not limited. For example, in embodiments, the structure of the etch blocking layer 210 may be determined depending on the shape of the upper electrode pattern 140. In embodiments, at least one of the plurality of etch blocking layers positioned on the sides of the upper electrodes (which may be different from one another) be connected to each other.

The etch blocking layer 210 may include a first portion A1 overlapping the upper electrode 140-1 and 140-2 in a vertical direction and a second portion A2 (which may not be overlapping) with the upper electrode 140-2 and 140-2 in the vertical direction, in accordance with embodiments. In embodiments, the first portion A1 and the second portion A2 may be in contact with each other and/or may be one unit.

For example, in embodiments, the first etch blocking layer 210-1 may be formed in the first trench 172 to cover the side 149-1 of the first upper electrode 140-1. The second etch blocking layer 210-2 may be formed in the second trench 174 to cover the side 149-2 of the second upper electrode 140-2, in accordance with embodiments.

The etch blocking layer 210 may have an underside in contact with a region (e.g. B1 or B2) of the etch stop film 120. The etch blocking layer 210 may be formed spaced from the first region A of the etch stop film 120 positioned on the lower electrode pattern 130, and may be in contact with the second region B1 and the third region B2 of the etch stop film 120.

For example, in embodiments, the first etch blocking layer 210-1 and the second etch blocking layer 210-2 may be formed spaced apart from the first region A. A second portion A2 of the first etch blocking layer 210-1 may be in contact with the second region B1 and/or a second portion A2 of the second etch blocking layer 210-2 may be in contact with the third region B2, in accordance with embodiments.

The first etch blocking layer 210-1 and the second etch blocking layer 210-2 may not overlap with the first region A. The second portion A2 of the first etch blocking layer 210-1 may overlap with the second region B1 in a vertical direction. The second portion A2 of the second etch blocking layer 210-2 may overlap with the third region B2 in a vertical direction.

The etch blocking layer 210 may be formed of a conductive material having etch selectivity higher than the first and second interlayer insulating layers 135 and/or 180 (e.g. tungsten or similar material).

In order to prevent metal ions of the etch blocking layers 210 from diffusing to the interlayer insulating layers 135 and 180, a barrier layer 212 or 214 may be formed between the etch blocking layer 210 and the trench 172 or 174, in accordance with embodiments. For example, the etch blocking layer 210 and the barrier layer 212 and/or 214 may be formed by a barrier material and an etch blocking material may be deposited on/over the second interlayer insulating layer 180 in succession to fill the trenches 172 and 174 by using CVD. The deposited barrier metal material may have a thickness of 50 Å~200 Å. The barrier metal material may be a material the same (or substantially the same) as the first to fourth barrier layers 132, 136, 142, and 146, in accordance with embodiments. In embodiments, the etch blocking material may be (but not limited to) tungsten or a similar material. In embodiments, the etch blocking material may be a conductive material having etch selectivity higher than the first and second interlayer insulating layers 135 and 180.

In embodiments, by planarizing the etch blocking material and the barrier metal material formed on/over the second interlayer insulating layer 180 to expose an upper surface of the second interlayer insulating layer 180, the etch blocking layer 210 and/or the barrier layer 212 and/or 214 may be formed in the trenches 172 and 174.

Referring to FIG. 2D, a photoresist pattern 190 may be formed on/over the second interlayer insulating layer 180 by photolithography, in accordance with embodiments. The photoresist pattern 190 may expose at least a portion of an upper side of the second interlayer insulating layer 180 positioned between the etch blocking layers (e.g. 210-1 and 210-2) of the plurality of the upper electrodes (e.g. 140-1 and 140-2), in accordance with embodiments. For example, the photoresist pattern 190 may expose at least a portion of the upper side of the second interlayer insulating layer 180 positioned between the first etch blocking layer 210-1 and the second etch blocking layer 210-2.

In embodiments, the second interlayer insulating layer 180 and the first interlayer insulating layer 135, positioned between the etch blocking layers 210-1 and 210-2 may be etched using the photoresist pattern 190 as an etch mask to form a cavity 230. For example, in embodiments, the etching for forming the cavity may include a first etching and a second etching. The first etching may dry etch the first interlayer insulating layer 180 and the first interlayer insulating layer 135 by using the photoresist pattern 190 as an etch mask to form a hole which exposes the etch stop film 120, according to embodiments. The etch stop film 120 may serve to stop etching of the first etching and the hole may expose a portion of the etch stop film 120, in accordance with embodiments.

The second etching wet may etch the second interlayer insulating layer 180 and the first interlayer insulating layer 135 etched by the first etching by using the photoresist pattern 190 as an etch mask to form the cavity 230 (which may expose the etch blocking layers 210-1 and 210-2), in accordance with embodiments. In embodiments, the cavity 230 may expose a side of each of the etch blocking layers 210-1 and 210-2 and the sides of the etch blocking layers 210-1 and 210-2 exposed and may face each other. For example, in embodiments, the second etching may be a wet etching using an etchant which is a mixture of at least one of DIW (DeIonized Water), DIW mixed with an HF group chemical, and/or a similar material or substance. In the second etching, the etchant may flow into the hole to etch the second interlayer insulating layer 180 and the first interlayer insulating layer 135.

The second etching may include at least one of the following steps: (1) Etching for 1 to 20 minutes with DHF (Diluted HF) with an HF to H2O ratio of 1~1000:1; and (2) Etching for 1 to 20 minutes with BHF (Buffered HF) with an NH4F to HF ratio of 3~100:1.

The etch blocking layer 210 may serve to protect the first upper electrode 140-1 and the second upper electrode 140-2 from the second etching. Since the etch blocking layers 210-1 and 210-2 may have an etch selectivity higher than the interlayer insulating layers 180 and 135 (which are not etched in the second etching), the etch blocking layers 210-1 and 210-2 may protect the first upper electrode 140-1 and the second upper electrode 140-2 from the second etching.

In embodiments, the cavity 230 may expose the first region A of the etch stop film 120 positioned on/over the lower electrode pattern 130 and expose the etch stop film 120 (which may serve to prevent the lower electrode pattern 130 from being damaged by the second etching). In embodiments, the cavity 230 may expose portions of the etch stop film 120 positioned between the first region A and the second region B1 and/or between the first region A and the third region B2.

In embodiments, the material of the second main electrode layer 144 of each of the first upper electrode 140-1 and the second upper electrode 140-2 (e.g. Cu, Al, Au, a Cu—Al alloy and/or a similar material) may be susceptible to damage by the etchant in the second etching. Accordingly, in embodiments, if the etchant in the second etching is a strong acid, the material of the main electrode layer 144 may be etched by the strong acid.

Accordingly, if there is no etch blocking layer 210 of embodiments, the second interlayer insulating layer 180 and the first interlayer insulating layer 135 may be wet etched in the second etching to expose the side and the upper side of each of the first upper electrode 140-1 and the second upper electrode 140-2, which may make the side of the main electrode layer 144 of each of the first upper electrode 140-1 and the second upper electrode 140-2 susceptible to damage by the etchant in the second etching, which may cause switching malfunctions in a semiconductor device, which may compromise reliability and manufacturing yield of the semiconductor device.

However, in embodiments, by forming the etch blocking layers 210-1 and/or 210-2 of a material having etch selectivity higher than the first and second interlayer insulating layers 135 and 180 to cover the side of the first upper electrode 140-1 or the second upper electrodes 140-2 (which is liable to be exposed in the second etching), embodiments may prevent the second main electrode layers 144 of the first upper electrode 140-1 and the second upper electrode 140-2 from being etched and damaged by the etchant in the second etching. In embodiments using tungsten in the etch blocking layers 210-1 and 210-2 (which may have a low extent of etching by the strong acid compared to the material of the second main electrode layer 144.

In embodiments, the formation of the upper electrode pattern 140 of a material substantially insensitive to the wet etching etchant for securing the cavity 230 the contact ball may be positioned therein and may enable optimized degrees of freedom of the upper electrode pattern 140. In embodiments, reliability of switching actions of semiconductor device may be reasonably assured and/or desirable manufacturing yield characteristics.

Embodiments with the etch blocking layer 210 not overlapping with the lower electrode pattern 130 in a vertical direction may not necessarily require a capacitor to be formed, which may avoid signal distortion.

Figure 3:
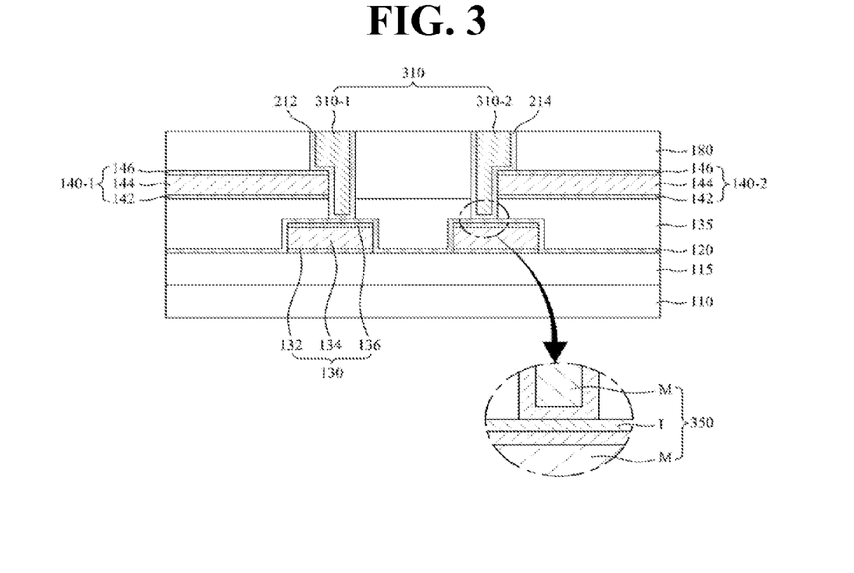
FIG. 3 illustrates a section of a semiconductor device showing a capacitor which may be formed between a lower electrode pattern and an etch blocking layer overlapped with each other, in accordance with embodiments.

Example FIG. 3 illustrates a section of a semiconductor device showing a capacitor 350 which may be formed between a lower electrode pattern and an etch blocking layer that overlap each other. As shown in FIG. 3, in accordance with embodiments, if the lower electrode pattern 130 and the etch blocking layers 310-1 and 310-2 overlap in a vertical direction, the etch blocking layer 310, the etch stop film 120, and/or the lower electrode 130 may form an MIM (Metal Insulator Metal) capacitor.

In embodiments, the etch blocking layer 310 may have one end within the etch stop film 120. The thickness of the etch stop film positioned between the etch blocking layer 310 and the lower electrode pattern capacitance of the MIM capacitor may be relatively large, in accordance with embodiments. In embodiments, a MIM capacitor 350 may undesirably cause malfunctions of the switching of semiconductor devices and/or distortion of signals.

Figure 2E:
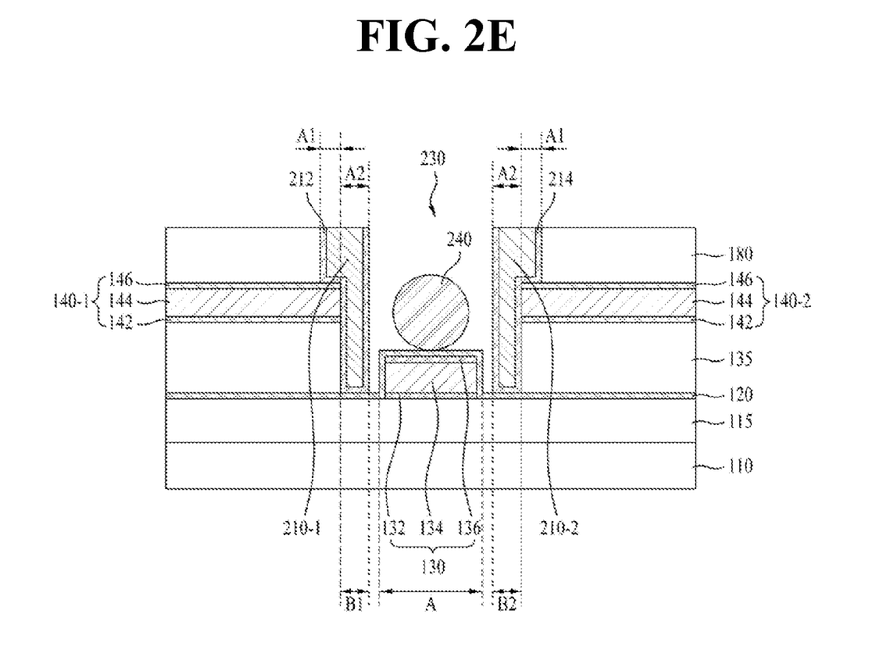

In embodiments, referring to FIG. 2E, since there is a structure in which the etch blocking layer 210 does not overlap with the lower electrode pattern 130 in the vertical direction, no MIM capacitor may be formed, which may prevent signal distortion and the switching malfunctions from taking place.

Referring to FIG. 2E, a contact ball 240 may be formed on/over the etch stop film 120 in the cavity 230, in accordance with embodiments. In embodiments, the contact ball 240 may be formed having a diameter smaller than a distance between the barrier layers exposed by the cavity 230. In embodiments, if there is no barrier layers 212 and 214, the contact ball 240 may have a diameter less than a distance between the etch blocking layers 210-1 and 210-2.

For example, the contact ball 240 may be formed by first forming a conductive material layer (e.g. a metal layer) on/over the etch stop film 120 in the photoresist pattern 190 and/or the cavity 230 for forming the contact ball 240, in accordance with embodiments. In embodiments, lift-off may be performed to remove the photoresist pattern 190 and the conductive material layer positioned thereon (e.g. altogether). In embodiments, the lift-off may not remove the conductive material layer from the etch stop film 120 in the cavity 230 to leave a portion of the conductive material on/over the etch stop film 120 in the cavity 230. In embodiments, the portion of the conductive material remaining in the cavity 230 may be subjected to annealing to form the contact ball 240 on/over the etch stop film 120 in the cavity 230. In embodiments, the cavity 230 may form an air void and as the contact ball 240 is brought into contact with any one of the first etch blocking layer 210-1 and the second etch blocking layer 210-2, the semiconductor device may perform the switching action.

Figure 1:
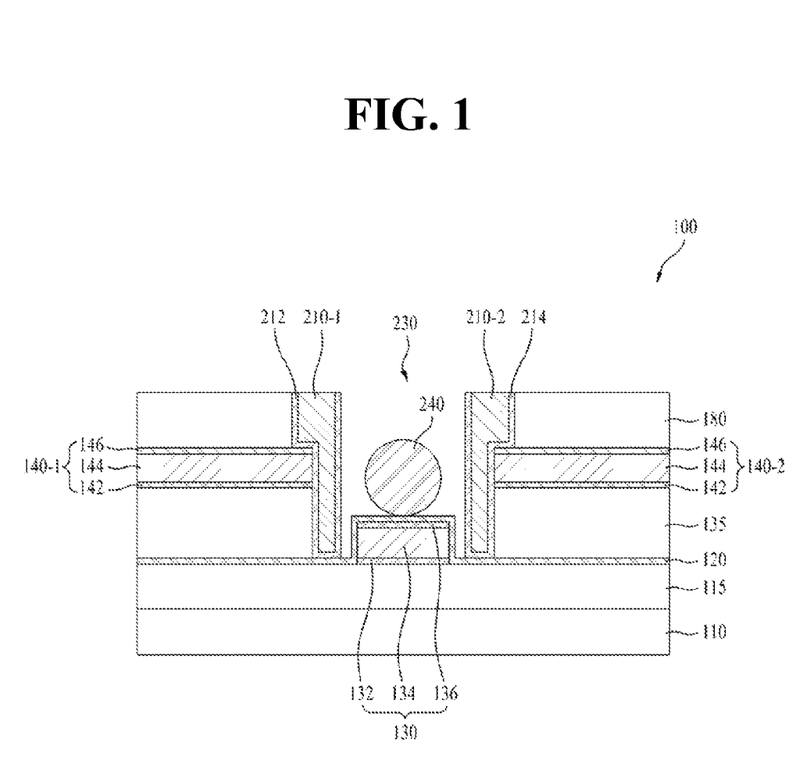
FIG. 1 illustrates a section of a semiconductor device, in accordance with embodiments.

FIG. 1 illustrates a section of a semiconductor device 100, in accordance with embodiments. The semiconductor device 100 may be a Micro Metal Sphere switch, in accordance with embodiments. Referring to FIG. 1, in embodiments, the semiconductor device 100 may include at least one of the following: (1) an insulating layer 115 formed on/over a substrate 110, (2) a lower electrode pattern 130 formed on/over the insulating layer 115, (3) an etch stop film 120 formed on/over the lower electrode pattern 130, (4) a first interlayer insulating layer 135 formed on/over the etch stop film 120, (5) an upper electrode pattern 140 formed on/over the first interlayer insulating layer 135, (6) a second interlayer insulating layer 180 formed on/over the upper electrode pattern 140, (7) a cavity 230 formed in the second interlayer insulating layer 180 and the first interlayer insulating layer 135 to expose a first region A of the etch stop film 120 positioned at a side of the upper electrode pattern 140 and on/over the lower electrode pattern 140, (8) a contact ball 240 positioned on the etch stop film 120 in the cavity 230, and/or (9) an etch blocking layer 210 formed on/over a side of the upper electrode pattern 140 exposed by the cavity 230.

The first etch blocking layer 210-1 and the second etch blocking layer 210-2 may not overlap with the first region A in a vertical direction. A second portion A2 of the first etch blocking layer 210-1 may overlap with the second region B1 in a vertical direction. A second portion A2 of the second etch blocking layer 210-2 may overlap with a third region B2 in the vertical direction.

The contact ball 240 may be brought into contact with any one of the first etch blocking layer 210-1 and the second etch blocking layer 210-2. The switching action of the device may be fixed depending on to which one of the first etch blocking layer 210-1 or the second etch blocking layer 210-2 the contact ball 240 is brought into contact.

For example, the upper electrode pattern 140 may further include a third upper electrode electrically separated from the first upper electrode 140-1 and the second upper electrode 140-2. The etch blocking layer 210 may further include a third etch blocking layer which covers a side of the third upper electrode.

If the contact ball 240 is brought into contact with the first etch blocking layer 210-1 and the third etch blocking layer at the same time, a first switching may take place, in which the first upper electrode 140-1 and the third upper electrode are connected electrically. If the contact ball 240 is brought into contact with the second etch blocking layer 210-2 and the third etch blocking layer at the same time, a second switching may take place, in which the second upper electrode 140-2 and the third upper electrode are electrically connected.

Figure 5A:
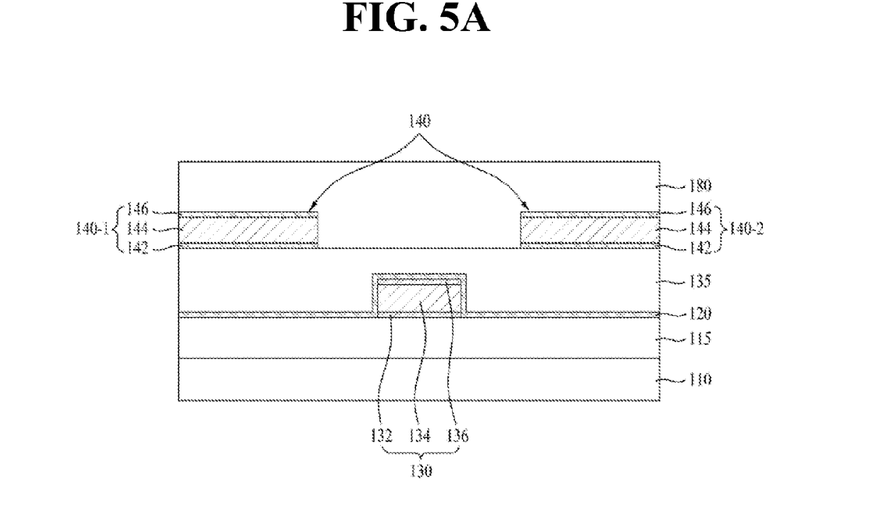
FIGS. 5A to 5E illustrate sections showing steps of a method for manufacturing a semiconductor device, in accordance with embodiments.
Figure 5B:
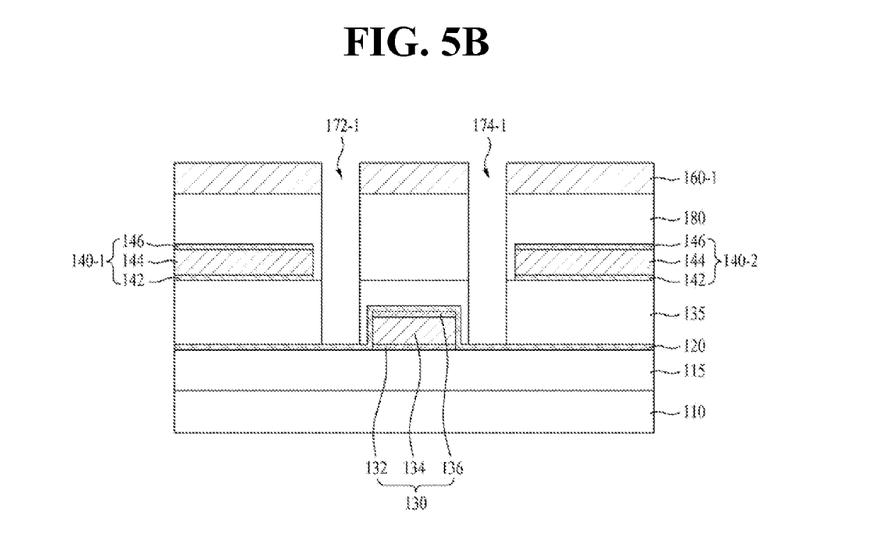

FIGS. 5A to 5E illustrate sections showing manufacturing of a semiconductor device, in accordance with embodiments. FIG. 5A illustrates an insulating layer 115, a lower electrode pattern 130, an etch stop film 120, a first interlayer insulating layer 135, an upper electrode pattern 140, and/or a second interlayer insulating layer 180 formed on/over a substrate 110. FIG. 5B illustrates a photoresist pattern 160-1 formed on/over the second interlayer insulating layer 180 for forming trenches 172-1, and 174-2, in accordance with embodiments. Trenches 172-1 and 174-2 may pass through the first interlayer insulating layer 135 and the second interlayer insulating layer 180 positioned between the lower electrode pattern 130 and the upper electrode pattern 140 to expose the etch stop film 120, in accordance with embodiments. Trench 172-1 and/or 174-2 may not expose a side of the upper electrode pattern 140 and may be formed spaced apart from the upper electrode pattern 140. Accordingly, in embodiments, there may be a portion of the second interlayer insulating layer 180 between the trench 172-1 and/or 174-2 and the upper electrode pattern 140.

Figure 5C:
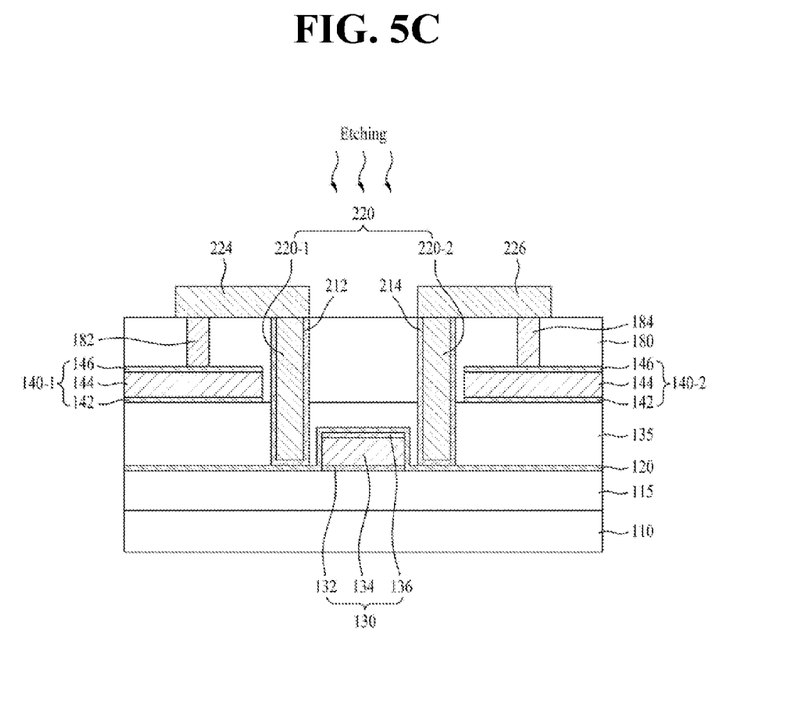

Referring to FIG. 5C, contacts 182 and 184 may be formed in the second interlayer insulating layer 180 and may be in contact with the upper electrode pattern 140 that passes through the second interlayer insulating layer 180, in accordance with embodiments. For example, the first contact 182 may have one end connected to an upper side of the first upper electrode 140-1 passing through the second interlayer insulating layer 180 and the second contact 184 has one end connected to an upper side of the second upper electrode 140-2 passing through the second interlayer insulating layer 180. In embodiments, the contact 182 and/or 184 may have the other end exposed to the upper side of the second interlayer insulating layer 180.

In embodiments, a conductive material may be filled in the trenches 172-1 and 174-2 to form an etch blocking layer 220. The etch blocking layer 220 and the contacts 182 and 184 may be formed at the same time, in some embodiments, but not in all embodiments. In embodiments, the trenches 172-1 and 174-2 for forming the etch blocking layer 220 and the via holes for forming the contacts 182 and 184 may be formed at the same time. After the conductive material which may be filled in the trenches 172-1 and 174-2 and the via holes, planarizing may be performed, in accordance with embodiments.

In embodiments, connection lines 224 and 226 may also be formed on/over the second interlayer insulating layer 180 for connecting the etch blocking layer 220 to the contacts 182 and 184. The connection lines 224 and 226 may be formed as one unit with the etch blocking layer 220. In embodiments, the connection lines 224 and 226 may be formed in the same step with the etch blocking layer 220. For example, in embodiments, after filling the conductive material in the trenches 172-1 and 174-2, the via holes, and on/over the second interlayer insulating layer 180, the conductive material on/over the second interlayer insulating layer 180 may be patterned by photolithography and etching to form the connection lines 224 and 226 and the etch blocking layer 220 at the same time.

The etch blocking layer 220 may be positioned in the trenches 172-1 and 174-2 and may not overlap with the upper electrode pattern 140 in a vertical direction, in accordance with embodiments. Between the etch blocking layer 220 positioned in the trench 172-1 or 174-2 and the upper electrode pattern 140, there may be a portion of the second interlayer insulating layer 180, in accordance with embodiments. In embodiments, the etch blocking layer 220 may be positioned in the trench 172-1 or 174-2 and the lower electrode pattern 130 does not overlap in a vertical direction, and there may be a portion of the first interlayer insulating layer 135 between the etch blocking layer 220 positioned in the trench 172-1 or 174-2 and the lower electrode pattern 130. The etch blocking layer 220 may be formed spaced apart from a first region A of the etch stop film 120 positioned on/over the lower electrode pattern 130, and may be in contact with a second region B1 and a third region B2 of the etch stop film 120. The etch blocking layer 220 may not overlap with the first region A in a vertical direction, and may overlap with the second region B1 and the third region B2 in the vertical direction.

Figure 5D:
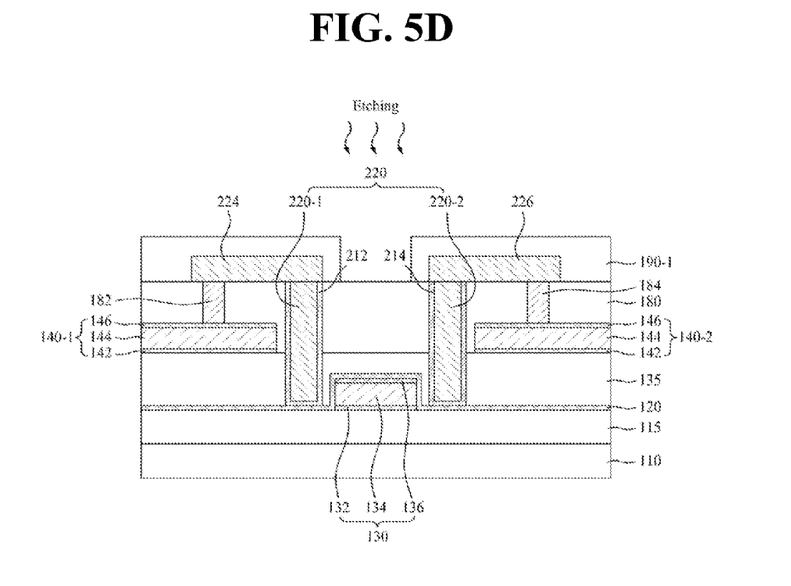

Referring to FIG. 5D, in embodiments, a photoresist pattern 190-1 may be formed on/over the second interlayer insulating layer 180. The photoresist pattern 190-1 may expose an upper side of the second interlayer insulating layer 180 positioned between the first etch blocking layer and the second etch blocking layer.

Figure 5E:
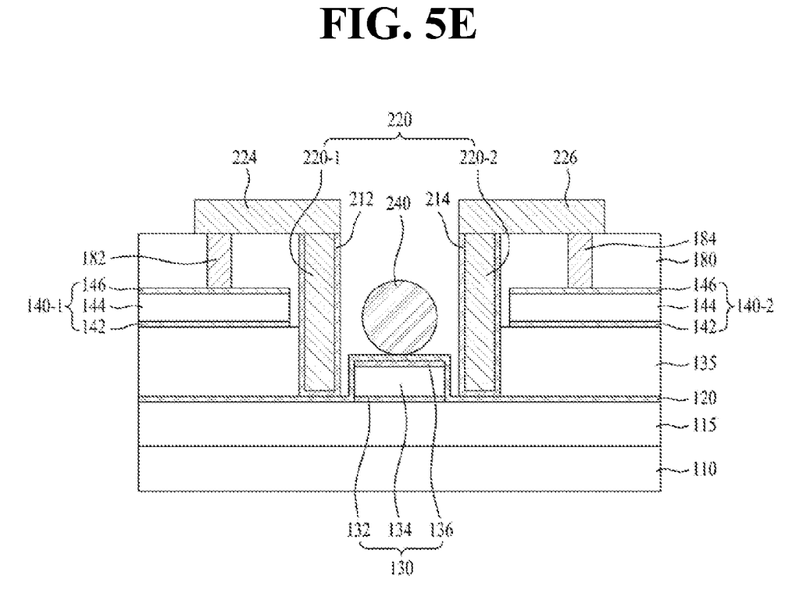

Referring to FIG. 5E, in embodiments, a cavity 230 may be formed in the second interlayer insulating layer 180 and the first interlayer insulating layer 135 by using the photoresist pattern 190-1 to expose the etch stop film 120. In embodiments, a contact ball 240 may be formed on/over the etch stop film 120 exposed in the cavity 230.

In embodiments, a structure in which the etch blocking layer 220 does not overlap with the lower electrode pattern 130 in a vertical direction may eliminate the necessity for a capacitor, which otherwise may cause signal distortion.

Figure 4:
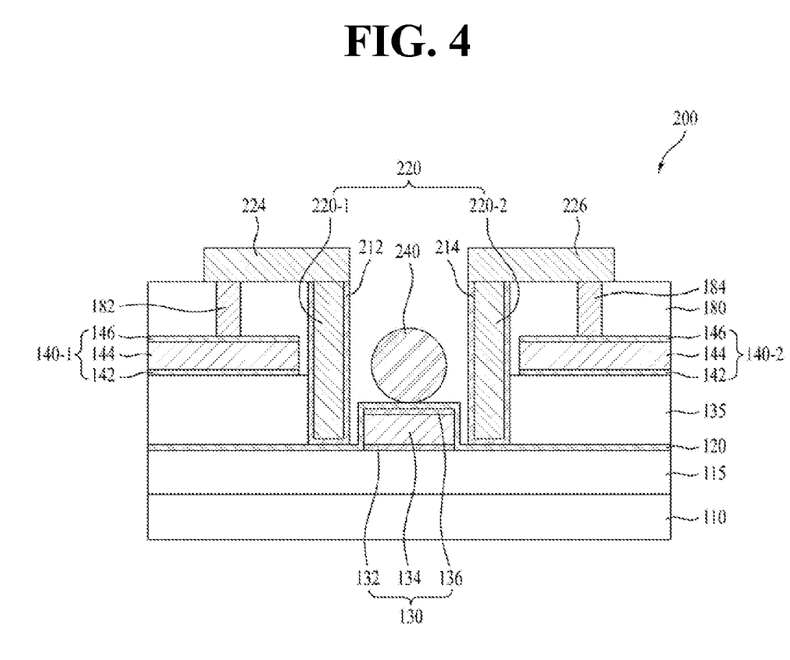
FIG. 4 illustrates a section of a semiconductor device, in accordance with embodiments.

FIG. 4 illustrates a section of a semiconductor device 200, in accordance with embodiments. In embodiments, the etch blocking layer 220 of the semiconductor device 200 does not cover a side of the upper electrode 140, but may be spaced from the upper electrode pattern 140. In order to connect the upper electrode pattern 140 to the etch blocking layer 220 electrically, the semiconductor device 200 may include contacts 182 and 184 each connected to the upper electrode 140 that may pass through the second interlayer insulating layer 180, in accordance with embodiments. In embodiments, connection lines 224 and 226 may be positioned on/over the second interlayer insulating layer 180 to connect the contacts 182 and 184 to the etch blocking layer 220, respectively.

Embodiments may permit formation of an upper electrode pattern which is insensitive to an etchant used in wet etching, which may result in securing space for positioning a contact ball. Accordingly, in some embodiments, degrees of freedom of the upper electrode pattern may be optimized, which may assure reliability of switching actions of a semiconductor device. In embodiments, manufacturing yield may be optimized.

Characteristics, structures, effects, and so on described in above embodiments are included to at least one of the embodiments of the present invention, but not limited to only one embodiment invariably. Furthermore, it is apparent that the features, the structures, the effects, and so on described in the embodiments can be combined, or modified with other embodiments by persons skilled in this field of art. Therefore, it is required to understand that such combination and modification is included to scope of the present invention.

What is claimed is:

1. A semiconductor device comprising:
    a lower electrode pattern on or over a substrate;
    an etch stop film over the lower electrode pattern and the substrate;
    a first interlayer insulating layer over the etch stop film;
    an upper electrode pattern over the first interlayer insulating layer;
    a second interlayer insulating layer over the upper electrode pattern;
    etch blocking layers between the lower electrode pattern and the upper electrode pattern, wherein the etch blocking layers pass through the second interlayer insulating layer and the first interlayer insulating layer, and the lower electrode pattern is between the etch blocking layers;
    a cavity in the second interlayer insulating layer and the first interlayer insulating layer, wherein the cavity is configured to expose at least a portion of a side of the etch blocking layer; and
    a contact ball in the cavity.

2. The semiconductor device of claim 1, wherein the etch blocking layers overlap with a region of the etch stop film between the lower electrode pattern and the upper electrode pattern in a vertical direction.

3. The semiconductor device of claim 1, wherein the etch blocking layers are in contact with a region of the etch stop film between the lower electrode pattern and the upper electrode pattern.

4. The semiconductor device of claim 1, wherein the etch blocking layers are in contact with at least a portion of a side of the upper electrode pattern.

5. The semiconductor device of claim 1, wherein:
    the etch blocking layers are spaced apart from the upper electrode pattern; and
    a portion of the second interlayer insulating layer is between the second etch blocking layer and the upper electrode pattern.

6. The semiconductor device as claimed in claim 5, further comprising:
    a contact connected to the upper electrode pattern and which passes through the second interlayer insulating layer; and
    a connection line over the second interlayer insulating layer and which connects the contact to the etch blocking layers.

7. The semiconductor device of claim 1, wherein the etch stop film comprises a material having a higher etch selectivity than the first interlayer insulating layer.

8. The semiconductor device of claim 7, wherein the etch selectivity is for a dry etchant that etches the first and second interlayer insulating layers.

9. The semiconductor device of claim 1, wherein the etch stop film comprises silicon nitride.

10. The semiconductor device of claim 9, wherein the first interlayer insulating layer includes at least one of $SiO_2$, $Si_xN_y$ (where x and y are real numbers), a fluorosilicate glass, an undoped silicate glass, a borophosphosilicate glass, and tetraethoxysilane.

11. The semiconductor device of claim 1, wherein the first interlayer insulating layer includes at least one of $SiO_2$, $Si_xN_y$ (where x, and y are real numbers), a fluorosilicate glass, an undoped silicate glass, a borophosphosilicate glass, and tetraethoxysilane.

12. The semiconductor device of claim 1, wherein the etch blocking layers comprise a conductive material.

13. The semiconductor device of claim 12, wherein the conductive material has a higher etch selectivity than the first and second interlayer insulating layers.

14. The semiconductor device of claim 13, wherein the etch selectivity is for each of a dry etchant and a wet etchant that etch the first and second interlayer insulating layers.

15. The semiconductor device of claim 12, wherein the conductive material comprises tungsten.

16. The semiconductor device of claim 15, further comprising a barrier material between the etch blocking layers and the first and second interlayer insulating layers.

17. The semiconductor device of claim 16, wherein the barrier material comprises a metal having a thickness of 50 Å to about 200 Å.

18. The semiconductor device of claim 16, wherein the barrier material comprises TiN, Ti, or TiN/Ti.

19. The semiconductor device of claim 1, wherein the etch blocking layers fill trenches on opposed sides of the lower electrode pattern, wherein each trench is between the lower electrode pattern and an adjacent electrode of the upper electrode pattern.

20. The semiconductor device of claim 19, wherein the trenches expose a portion of the upper electrode pattern.

* * * * *